United States Patent [19]
Huckels et al.

[11] Patent Number: 5,928,959
[45] Date of Patent: Jul. 27, 1999

[54] DISHING RESISTANCE

[75] Inventors: Kai Huckels, Poughkeepsie; Matthias Ilg, Fishkill, both of N.Y.

[73] Assignee: Siemens Aktiengesellschaft, Munich, Germany

[21] Appl. No.: 08/940,808

[22] Filed: Sep. 30, 1997

[51] Int. Cl.⁶ .................................................. H01L 21/302
[52] U.S. Cl. ........................ 438/691; 438/692; 438/702
[58] Field of Search .................................... 438/691, 692, 438/633, 702

[56] References Cited

U.S. PATENT DOCUMENTS 5,356,513  10/1994  Burke et al. ............................ 438/633
5,516,729   5/1996  Dawson et al. ......................... 438/633

*Primary Examiner*—Benjamin Utech
*Assistant Examiner*—Kin-Chan Chen
*Attorney, Agent, or Firm*—Stanton C. Braden

[57] ABSTRACT

Fabrication of devices that produces a surface with reduced dishing caused by polishing. The reduced dishing is the result of forming a first layer that partially covers a complex surface topography and a second layer the covers the surface topography. The second layer being more resistant to polishing than the first so as to reduce dishing in the wide spaces of the complex topography.

39 Claims, 2 Drawing Sheets

DISHING RESISTANCE

The field of the present invention relates generally to semiconductor fabrication and, more particularly, to reduce dishing that occurs during planarization.

BACKGROUND OF THE INVENTION

In device fabrication, insulating, semiconducting, and conducting layers are formed on a substrate. The layers are patterned to create features and spaces. The minimum dimension or feature size (F) of the features and spaces depends on the resolution capability of the lithographic systems. The features and spaces are patterned so as to form devices, such as transistors, capacitors, and resistors. These devices are then interconnected to achieve a desired electrical function, creating an integrated circuit (IC).

As the features and spaces decrease due to smaller and smaller F, it has become more difficult to fill the smaller gaps between the features with, for example, dielectric material. To enhance gapfill, doped silicate glass such as borophosphosilicate glass (BPSG) has been used. Doped silicate glass is effective in filling gaps due to its relatively low melting point, which allows it to be reflowed after being deposited.

Conventionally, BPSG is formed by various chemical vapor deposition (CVD) techniques. The BPSG is deposited at a relatively low temperature of about 400° C. After deposition, the substrate is heated to at a high enough temperature to cause the glass to soften and flow. For example, annealing the BPSG at a temperature of 800° C. causes the glass to flow and fill the gaps between the features.

Typically, different regions of the IC have different pattern factors, creating a complex topography on the surface of the substrate of device layer. Pattern factor is defined as the ratio of patterned and unpatterned areas. For example, in the array region of the dynamic random access memory (DRAM) IC, the patterned density is relatively high compared to that of the support or logic regions. As such, the spaces between the features are narrower in the array region versus those in the support or logic region. The doped silicate glass, although fills the gaps, is relatively conformal. That is, the topography of the underlying substrate or device layer is replicated in the deposited doped silicate glass.

After deposition, the doped silicate glass is polished by, for example, chemical mechanical polish (CMP) to provide a planar surface. A highly planarized surface topography is desirable since it allows for the deposition of additional integrated circuit components and permits greater device density. However, the complex topography creates difficulty in achieving a planar surface with CMP. In particular, dishing of the doped silicate glass occurs in wide spaces. Such dishing adversely impacts surface planarity, decreasing the depth of focus of subsequent lithographic processes.

From the above discussion, achieving gapfill of device structures with reduced dishing during CMP is desired.

SUMMARY OF THE INVENTION

The invention relates to fabrication of devices. In particular, the invention provides improved surface planarity after polishing. In one embodiment, a first layer is provided over a substrate having a complex topography. The first layer is deposited in a thickness sufficient to fill at least the narrow gaps. A second layer is then formed over the first dielectric layer to fill the wide gaps. The second layer is more resistant to polishing than the first layer. By providing the second layer more polish resistant layer, surface planarity is improved after polishing.

DETAILED DESCRIPTION OF THE INVENTION

The present invention reduces dishing as a result of polishing during semiconductor fabrication. To facilitate discussion of the invention, it is described in the context of forming a DRAM IC. However, the invention is significantly broader and is applicable to semiconductor fabrication in general where dishing is a concern. A description of a DRAM cell and a conventional process for using doped silicate glass as gap fill is provided before discussing the invention.

Figure 1:
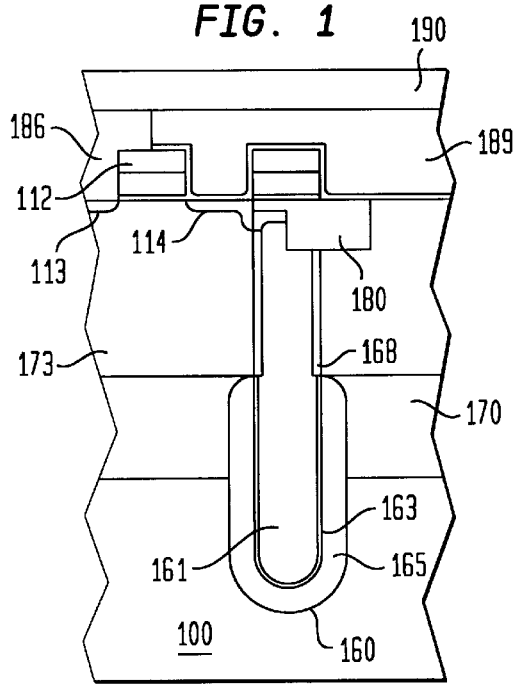
FIG. 1 illustrates an illustrative DRAM cell.

Referring to FIG. 1, a conventional trench capacitor DRAM cell 100 is shown. Such conventional trench capacitor DRAM cell is described in, for example, Nesbit et al., A 0.6 $\mu m^2$ 256 Mb Trench DRAM Cell With Self-Aligned Buried Strap (BEST), IEDM 93-627, which is herein incorporated by reference for all purposes. Typically, an array of cells are interconnected by wordlines and bitlines to form a DRAM chip.

The DRAM cell 100 comprises a trench capacitor 160 formed in a substrate 101. The trench is filled with, typically, polysilicon (poly) 161 that is heavily doped with n-dopants. The poly serves as one plate of the capacitor, is referred to as a "storage node." A buried plate 165 doped with n-type dopants surrounds the lower portion of the trench. In the upper portion the trench is a collar 168 to reduce parasitic leakage. A node dielectric 163 separates the two plates of the capacitor. A buried well 170 comprising n-type dopants is provided to connect the buried plates of the DRAM cells in the array. Above the buried well is a p-well 173, which is provided to reduce vertical leakage.

The DRAM cell also comprises a transistor 110. The transistor includes a gate 112 and source 113, and drain 114 diffusion regions comprising n-type dopant. Connection of the transistor to the capacitor is achieved via a diffusion region 125, referred to as the "node diffusion. The gate stack, also referred to as the "wordline", typically comprises poly and nitride layers. Alternatively a polycide layer which comprises a layer of silicide, such as molybdenum ($MoSi_x$), tantalum ($TaSi_x$), tungsten ($WSi_x$), titanium ($TiSi_x$) or cobalt ($CoSi_x$), is disposed over a layer of poly to reduce wordline resistance. In one embodiment, the polycide layer comprises $WSi_x$ over poly. A nitride liner covers the gate stack and substrate. The nitride layer and nitride liner serves as an etch or polish stop layer for subsequent processing.

A shallow trench isolation (STI) 180 is provided to isolate the DRAM cell from other cells or devices. A wordline is formed over the trench and isolated therefrom by the STI. The wordline is referred to as the "passing wordline". Such configuration is referred to as a folded bitline architecture.

An interlevel dielectric layer 189 is formed over the wordlines. A conductive layer, representing a bitline, is formed over the interlevel dielectric layer. A bitline contact opening 186 is provided in the interlevel dielectric layer to contact the source 113 to the bitline 190.

Figure 2A:
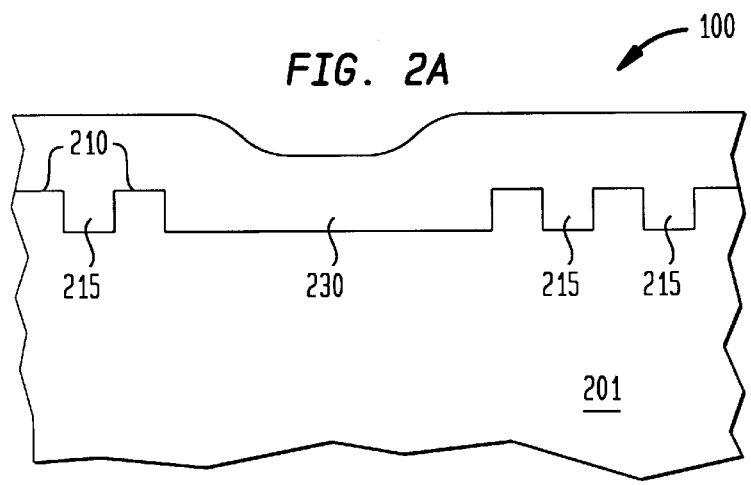
FIGS. 2a–b show a conventional process for filling gaps in a device layer using doped silicate glass that results in dishing when polished.
Figure 2B:
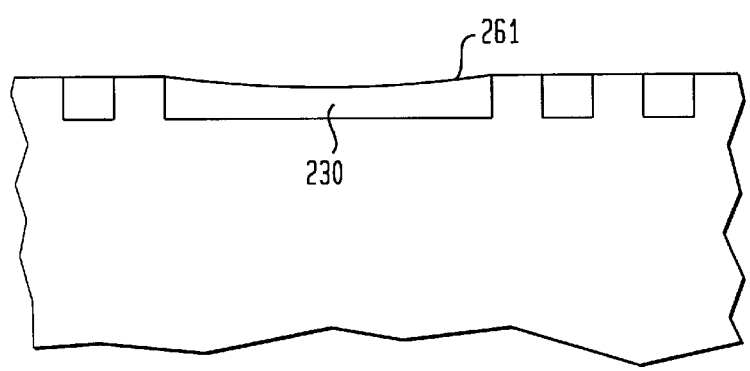

FIGS. 2a–b show a conventional process for filling gaps with reduced dishing. Referring to FIG. 2a, a cross section of a partially completed IC structure 100 is shown. The structure 100 is formed on a semiconductor substrate 201, which, for example, comprises a silicon wafer. The substrate may itself comprise layers of structure stacked one upon the other. For purposes of discussion, such structures are generally referred herein as a substrate.

Illustratively, the surface of the substrate includes mesas 210 and 212 separated by spaces 215 and 230. The mesas, for example, represent transistor gate stacks such as those described in FIG. 1. The gate stacks are formed by, for example, forming the gate stack layers on the substrate and patterning it using convention lithographic and etching techniques.

The components of an IC generally vary in size. Consequently, the size of the mesas or active regions also vary. As depicted, mesas 210 are of the narrow variety and mesas 212 are of the wider variety. Further, the spaces between the mesas also vary in dimension. As shown, spaces 215 are relatively narrow and space 230 is relatively wide. The actual size of the active mesas and spaces, however, is not critical. As it is desirable to fabricate IC structures with high component density, the narrow mesas and spaces typically correspond to about the F while the wider variety corresponds to about greater than F.

A doped silicate glass layer 230 such as BPSG is deposited over the surface of the substrate, filling the spaces. Due to the conformality of the BPSG, the topography of the underlying substrate is reflected in the BPSG layer as well.

Referring to FIG. 2b, the doped silicate glass layer is planarized by, for example, CMP. The CMP polishes the silicate glass layer, using the top of the mesas as a polish stop. As a result, the doped silicate glass and the top of the mesas are co-planar. However, excessive erosion or dishing of the doped silicate glass layer in the wide space 230 occurs, causing a depression 261 to form.

Figure 3A:
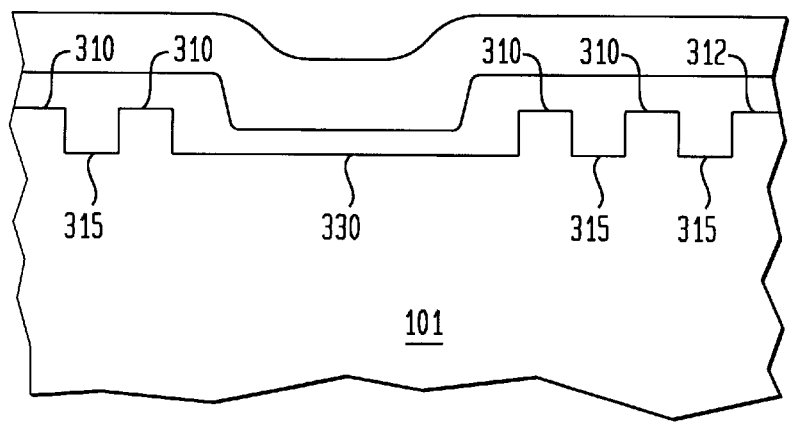
FIGS. 3a–3c show an illustrative process in accordance with one embodiment of the invention for reducing dishing resulting from polishing.
Figure 3B:
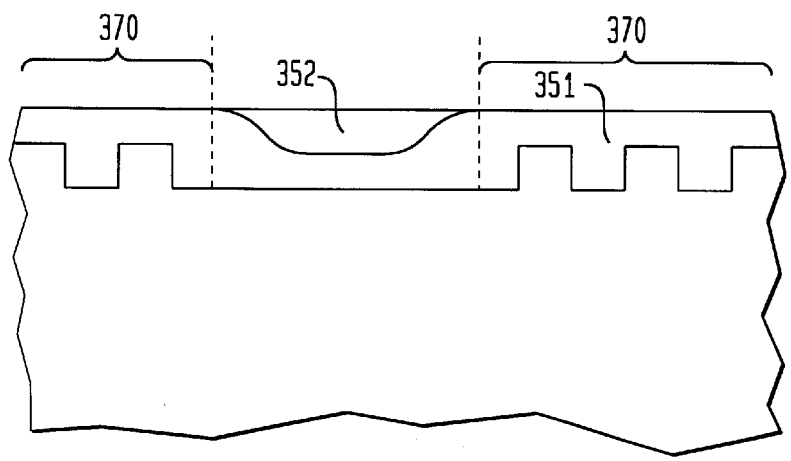
Figure 3C:
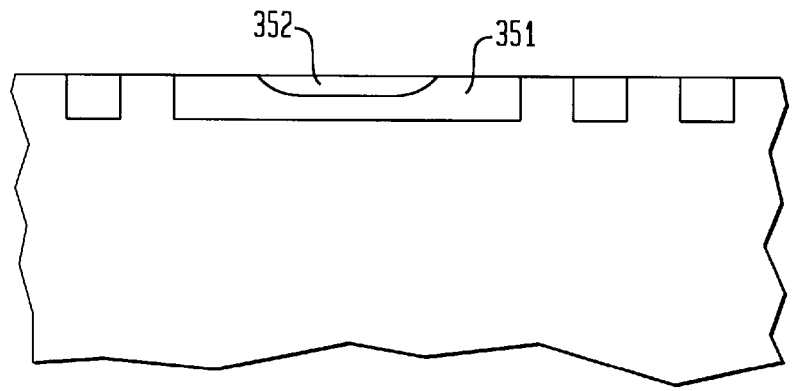

In accordance with the invention, a gap fill layer is provided having improved dishing resistance. FIGS. 3a–c show one embodiment of the invention. Referring to FIG. 3a, a cross section of a partially completed IC structure 300 is shown. The IC structure is, for example, a random access memory (RAM) IC, including a dynamic random access memory (DRAM), a synchronous DRAM (SDRAM), and a read only memory (ROM). Other ICs include programmable logic arrays (PLAs), field programmable gate arrays (FPGAs), application specific ICs (ASICs), merged DRAM-logic ICs or other type of ICs. Typically, a plurality of ICs are formed on the wafer in parallel. After processing is finished, the wafer is diced to separate the ICs to individual chips. The chips are then packaged, resulting in a final product that is used in, for example, consumer products such as computer systems, cellular phones, personal digital assistants (PDAs), and other electronic products. However, the invention is described in the context of forming an IC for ease of understanding. Further, the IC can be in any stage of processing.

The structure 101 is formed on a semiconductor substrate 101. In one embodiment, substrate 300 comprises a silicon wafer. Other substrates comprising, for example, gallium arsenide, germanium, silicon on insulator (SOI), glass, or other materials, are also useful. The substrate, for example, may be lightly or heavily doped with dopants of a predetermined conductivity to achieve a desired electrical characteristics.

As shown, the substrate includes narrow and wide mesas 310 and 312 separated by narrow and wide spaces 315 and 330. A first layer of dielectric material is deposited on the surface of the substrate. The thickness of the first dielectric layer is sufficient to fill the narrow gaps 315. Since the narrow gaps are typically equal to F, the thickness of the first dielectric layer in one embodiment is at least ½ F. The thickness of the first dielectric layer is such that, in the wide space 330, it is less then height H of the mesas.

The first dielectric layer comprises doped silicate glass such as BPSG, to provide adequate fill of the narrow structures. Other doped silicate glass, such as BSG or others that have good gap fill properties, are useful. Doped silicate glass advantageously has a lower melting point to that of undoped silicate glass, enabling the filling of the narrow gaps with a lower thermal budget than that achievable with undoped silicate glass. The various types of doped silicate glass are deposited using various known CVD techniques. Typically, the doped silicate glass is deposited by CVD and annealed at a temperature sufficient to cause to flow, filling the gaps between the mesas.

The dopant concentration of the doped silicate glass affects its melting temperature. The higher the dopant concentration, the lower the melting temperature of the glass and vice-versa. Typically, the dopant concentration of the doped silicate glass is chosen to effectively fill the narrow gaps within a given thermal budget. However, at excessively high dopant concentrations, the dopants tend to precipitate and form large acid crystals.

In one embodiment, the first doped silicate glass layer comprises BPSG. The dopant concentration of the BPSG is preferably below that which causes the formation of surface crystals. In one embodiment, the dopant concentration of B and P is less than about 11 wt %.

A second dielectric layer is deposited over the first dielectric layer. The thickness of the second dielectric layer is sufficient to completely fill the wide spaces so that a planar surface between the dielectric layers and the top of mesas is produced after a subsequent polish step.

The second dielectric layer is selected to have a lower CMP rate than the first dielectric layer. The second dielectric layer is sufficiently more resistant to CMP than the first dielectric layer to reduce the occurrence of dishing. A polish selectivity between the first and second layer is, of greater than 1:1, is useful in reducing dishing. Preferably, the selectivity is about 3:1. If the selectivity is too high, a reverse dishing effect in the wide space may occur (i.e., wide space being elevated). In one embodiment, the second dielectric layer comprises undoped silicate glass such as TEOS.

As is known, CMP rate depends on dopant concentration of the doped silicate glass layer. Lowering the concentration of the doped silicate glass decreases its CMP rate. In another embodiment, the second dielectric layer comprises a doped silicate glass having a dopant concentration that is less than the first dielectric layer. For example, if the first dielectric layer comprises BPSG, PSG can be used as the second dielectric layer. As long as the second dielectric layer is more resistant than the first dielectric layer, dishing resistance is improved.

Referring to FIG. 3b, the surface of the wafer is polished by, for example, CMP. The CMP is selective to the top surface of the mesas. The top of the mesas is capped with, for example, nitride. As such, the CMP is selective to nitride, using it as an polish stop. Due to the topography created by the mesas, the raised portions 370 of the second dielectric layer are attacked by the CMP first. As a result, the CMP exposes the first dielectric in regions 370 first while leaving the second dielectric layer covering the wide space 330. As shown, the CMP at this stage produces a relatively planar surface with the top surface of the first and second dielectric layers 351 and 352.

Referring to FIG. 3c, the CMP continues. Because the second dielectric layer has a slower CMP rate than the first dielectric layer, the first dielectric layer is removed more quickly than the second dielectric layer. As can be seen, the more CMP resistant second dielectric layer serves to reduce or prevent dishing from occurring in the wide space 330 while the dielectric layers are polished down to the etch stop layer (top of the mesas).

While the invention has been particularly shown and described with reference to various embodiments, it will be recognized by those skilled in the art that modifications and changes may be made to the present invention without departing from the scope thereof. The scope of the invention should therefore be determined not with reference to the above description but with reference to the appended claims along with their full scope of equivalents.

We claim:

1. A method for providing an improved planar surface after polishing comprising:
   providing a substrate having a topography, wherein the topography includes features separated by narrow spaces and wide spaces, wherein a top surface of the features serves as a polish stop;
   forming a first layer over the substrate comprising a doped silicate glass;
   heating to reflow the doped silicated glass in order to fill the narrow spaces but not the wide spaces, wherein the filling of the narrow spaces produces a substantially planar surface over the narrow spaces and the features separated by the narrow spaces;
   conformally forming a second layer over the substrate to fill the wide spaces, wherein the second layer comprises a lower polishing rate than the first layer;
   polishing the surface of the substrate, wherein the second layer reduces dishing in the wide spaces to produce a planar surface with the top of the features.

2. A method for improving substrate surface planarity after chemical mechanical polish (CMP), said method comprising:
   providing a substrate having thereon a narrow gap and a wide gap, said wide gap being wider than said narrow gap;
   conformally depositing a first dielectric layer formed of a first dielectric material comprising a doped-silicate glass over said substrate;
   heating to reflow the doped silicate to fill said narrow gap without completely filling said wide gap and to form a substantially planar surface over the narrow gap;
   conformally depositing a second dielectric layer formed of a second dielectric material over said first dielectric layer, said second dielectric material being more resistant to said CMP than said first dielectric material, said second dielectric layer being arranged to fill said wide gap; and
   planarizing an upper surface of said substrate using said CMP, said planarizing leaving some of said second dielectric layer in said wide gap after planarizing to reduce dishing therein and to improve said substrate surface planarity.

3. The method of claim 2 wherein a thickness of said first dielectric layer is equal to at least ½ of a width of said narrow gap.

4. The method of claim 2 wherein said doped-silicate glass comprises doped borophosphosilicate glass (BPSG).

5. The method of claim 4 wherein said doped BPSG has a dopant concentration of boron and phosphorous of less than about 11% in weight.

6. The method of claim 4 wherein said second dielectric material is phosphorous-doped silicate glass (PSG).

7. The method of claim 2 wherein a polish selectivity between said second dielectric material and said first dielectric material is about 3:1.

8. The method of claim 2 wherein said first dielectric material is a first doped silicate glass, wherein a dopant concentration in said second doped silicate glass is less than a dopant concentration in said first doped silicate glass.

9. The method of claim 2 wherein said wide gap and said narrow gap are disposed between features employed to fabricate dynamic random access memory (DRAM) circuits.

10. In the manufacture of a dynamic random access memory (DRAM) integrated circuit, a method for improving substrate surface planarity after chemical mechanical polish (CMP) of a substrate, said method comprising:
    providing a substrate having thereon a narrow gap and a wide gap, said wide gap being wider than said narrow gap, said narrow gap being disposed between first mesas, said wide gap being disposed between one of the first mesas and a second mesa, a height of said first mesas being substantially equal to a height of said second mesa, wherein top surfaces of said first and second mesas serves as a polish stop;
    conformally depositing a first dielectric layer formed of a first dielectric material comprising a doped-silicate glass;
    heating to reflow the first dielectric material to fill said narrow gap at least to a height of said first mesa without filling said wide gap to a height of said second mesa and to produce a planar surface over the narrow gap and first mesas;
    conformally depositing a second dielectric layer formed of a second dielectric material over said first dielectric layer, said second dielectric material being more resistant to said CMP than said first dielectric material, said second dielectric layer being arranged to fill said wide gap at least to said height of said second mesa; and
    planarizing an upper surface of said substrate using said CMP, said planarizing leaving some of said second dielectric layer in said wide gap after planarizing to reduce dishing therein and to improve said substrate surface planarity.

11. The method of claim 10 wherein said first dielectric material is doped borophosphosilicate glass (BPSG).

12. The method of claim 10 wherein said second dielectric material is a second doped silicate glass, a dopant concentration in said second doped silicate glass is less than a dopant concentration in said first dielectric layer.

13. In the fabrication of integrated circuits, a method for polishing comprising:
    providing a substrate having a partially formed integrated circuit, the substrate comprising a narrow space disposed between first features and a wide space dispose between second features;
    forming a first layer over the substrate, the first layer comprising a doped-silicate glass;
    heating to reflow the doped-silicate glass to fill the narrow spaces without filling the wide spaces, wherein the heating to reflow the doped silicate glass produces a substantially planar surface over the narrow space; and the first features depositing a second layer on the substrate, wherein the second layer conformally covers the substrate to fill the wide space, the second layer comprises a second material having a lower polishing rate than the first layer; and polishing the substrate, wherein the second layer disposed in the wide space reduces dishing therein to improve surface planarity.

14. The method recited in claim 13 wherein the doped silicate glass consists of BSG or BPSG.

15. The method as recited in claim 13 wherein the doped-silicate glass comprises a concentration of dopants to fill the narrow space without precipitating to form crystals.

16. The method as recited in claim 15 wherein the concentration is less than about 11%.

17. The method as recited in claim 16 wherein the second layer comprises a second doped-silicate glass having a lower polishing rate than the first layer.

18. The method as recited in claim 17 wherein a height of the first features is about the same as a height of the second features.

19. The method as recited in claim 18 wherein top surfaces of the first and second features serve as a polishing stop for the polishing.

20. The method as recited in claim 19 wherein the top surfaces of the first and second features comprise silicon nitride.

21. The method as recited in claim 20 wherein the partially formed integrated circuit comprises a partially formed memory integrated circuit.

22. The method as recited in claim 21 further comprises:
processing to complete the partially formed integrated circuit;
incorporating the integrated circuit in a consumer product.

23. The method as recited in claim 16 wherein the second layer comprises an undoped-silicate glass having a lower polishing rate than the first layer.

24. The method as recited in claim 23 wherein a height of the first features is about the same as a height of the second features.

25. The method as recited in claim 24 wherein top surfaces of the first and second features serve as a polishing stop for the polishing.

26. The method as recited in claim 25 wherein the partially formed integrated circuit comprises a partially formed memory integrated circuit.

27. The method as recited in claim 25 further comprises:
processing to complete the partially formed integrated circuit; and
incorporating the integrated circuit in a consumer product.

28. The method as recited in claim 13 wherein the second layer comprises a second doped-silicate glass having a lower polishing rate than the first layer.

29. The method as recited in claim 28 wherein the first layer comprises BPSG.

30. The method as recited in claim 29 wherein a height of the first features is about the same as a height of the second features and top surfaces of the first and second features serve as a polishing stop for the polishing.

31. The method as recited in claim 30 wherein the top surfaces of the first and second features comprise silicon nitride.

32. The method as recited in claim 31 wherein the partially formed integrated circuit comprises a partially formed memory integrated circuit.

33. The method as recited in claim 32 further comprises:
processing to complete the partially formed integrated circuit;
incorporating the integrated circuit in a consumer product.

34. The method as recited in claim 28 wherein the first layer comprises BSG.

35. The method as recited in claim 34 wherein a height of the first features is about the same as a height of the second features and top surfaces of the first and second features serve as a polishing stop for the polishing.

36. The method as recited in claim 35 wherein the top surfaces of the first and second features comprise silicon nitride.

37. The method as recited in claim 36 wherein the partially formed integrated circuit comprises a partially formed memory integrated circuit.

38. The method as recited in claim 37 further comprises:
processing to complete the partially formed integrated circuit;
incorporating the integrated circuit in a consumer product.

39. The method as recited in claim 13 wherein the second layer comprises an undoped-silicate glass having a lower polishing rate than the first layer.

* * * * *